US010711347B2

(12) United States Patent
DuBois et al.

(10) Patent No.: US 10,711,347 B2
(45) Date of Patent: Jul. 14, 2020

(54) MICRO-VOLUME DEPOSITION CHAMBER

(71) Applicant: Applied Materials, Inc., Santa Clara, CA (US)

(72) Inventors: Dale R. DuBois, Los Gatos, CA (US); Karthik Janakiraman, San Jose, CA (US); Kien N. Chuc, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 382 days.

(21) Appl. No.: 15/486,548

(22) Filed: Apr. 13, 2017

(65) Prior Publication Data

US 2017/0298509 A1    Oct. 19, 2017

Related U.S. Application Data

(60) Provisional application No. 62/322,907, filed on Apr. 15, 2016.

(51) Int. Cl.
| C23C 16/40 | (2006.01) |
| C23C 16/455 | (2006.01) |
| C23C 16/44 | (2006.01) |
| C23C 16/458 | (2006.01) |

(52) U.S. Cl.
CPC .... *C23C 16/45544* (2013.01); *C23C 16/4409* (2013.01); *C23C 16/4585* (2013.01); *C23C 16/45536* (2013.01); *C23C 16/45591* (2013.01)

(58) Field of Classification Search
CPC ........ C23C 16/45544; C23C 16/45591; C23C 16/4585; C23C 16/4409; C23C 16/45536; H01L 21/0228; H01L 21/205; H01L 21/683
USPC ........................ 118/715; 156/345.33, 345.34
See application file for complete search history.

(56) References Cited

U.S. PATENT DOCUMENTS

| 2006/0151114 A1 | 7/2006 | Fink |
| 2007/0054496 A1 | 3/2007 | Paduraru et al. |
| 2010/0096084 A1 | 4/2010 | Lee et al. |
| 2011/0136346 A1 | 6/2011 | Geissbühler et al. |
| 2012/0009765 A1* | 1/2012 | Olgado ............. C23C 16/45508 438/478 |
| 2014/0127911 A1 | 5/2014 | Shih et al. |

OTHER PUBLICATIONS

PCT International Search Report and Written Opinion in PCT/US2017/027395 dated Jul. 25, 2017, 11 pages.
PCT International Preliminary Report on Patentability in PCT/US2017/027395 dated Oct. 25, 2018, 8 pages.

* cited by examiner

*Primary Examiner* — Rudy Zervigon
(74) *Attorney, Agent, or Firm* — Servilla Whitney LLC

(57) ABSTRACT

Processing chambers having a lid with a lower surface, a substrate support with an upper surface facing the lid and an inner baffle ring between the substrate support and the lid are described. Methods of using the processing chamber are described.

19 Claims, 5 Drawing Sheets

MICRO-VOLUME DEPOSITION CHAMBER

CROSS-REFERENCE TO RELATED APPLICATIONS

This application claims priority to U.S. Provisional Application No. 62/322,907, filed Apr. 15, 2016, the entire disclosure of which is hereby incorporated by reference herein.

FIELD

Embodiments of the disclosure generally relate to an apparatus and a method for semiconductor processing. More specifically, embodiments of the disclosure are directed to micro-volume deposition chambers and methods of use.

BACKGROUND

Atomic layer deposition is a process commonly used to form thin films in the semiconductor industry. A typical process includes positioning a substrate in a reactor and providing a first precursor to the reactor. The first precursor deposits a first species on the substrate surface until the surface is saturated with the first species, after which deposition stops. A second precursor is then provided to the chamber. The second precursor reacts with the first species lining the surface of the substrate until no more of the first species is available to react, after which deposition stops. Such cycles are repeated until a desired thickness of the layer is formed. The chamber is typically purged between precursors to provide controlled layering on the substrate.

The atomic layer deposition process is useful for forming layers having very uniform thickness and composition because the deposition reaction is controlled at the molecular, or atomic, level. The first species only adheres to the substrate surface if an adhesion site is available. Every instance of the first species adheres to the substrate surface in the same way, so that it can participate in the reaction with the second precursor in the same way.

The layer deposited in each deposition operation is monomolecular or monatomic. Typically, the species deposited are no larger than small molecules. Thus, each layer deposited typically has a thickness of 5 Å or less. Each cycle consisting of two precursor operations and two purge operations may take up to a minute to execute. More complex cycles involving more than two precursors may take longer. Forming layers 50-100 Å thick may take 10-20 minutes. To improve rates in ALD processes, one or more precursors may be activated, for example by forming a plasma. The precursor is flowed into the chamber, and then plasma is formed to activate deposition. Plasma is typically discontinued when deposition from the precursor is complete. Fast cycling of gases promotes high throughput. Thus, there is a continuing need for apparatus and methods for fast cycling in PEALD processes.

SUMMARY

One or more embodiments of the disclosure are directed to a processing chamber comprising a lid, a substrate support and an inner baffle ring. The lid has a lower surface. The substrate support has an upper surface facing the lower surface of the lid. The inner baffle ring comprises a plurality of openings and is positioned between the lower surface of the lid and the upper surface of the substrate support.

Additional embodiments of the disclosure are directed to a processing chamber comprising a sidewall, a lower wall and a lid. The lid has a lower surface. The sidewall has a vacuum plenum and an opening forming fluid connection between the vacuum plenum and an interior of the processing chamber. A substrate support in the processing chamber has an upper surface facing the lower surface of the lid. The substrate support is movable so that the upper surface can be moved closer to or further from the lower surface of the lid. A liner is adjacent the sidewall and has an extension that extends radially inward. The processing chamber includes an outer baffle ring and an inner baffle ring. The outer baffle ring comprises a plurality of openings aligned with the opening in the sidewall. The inner baffle ring comprises a plurality of openings and is positioned between the lower surface of the lid and the upper surface of the substrate support. The inner baffle ring is movable between a loading position in which the inner baffle ring contacts the extension of the liner and a processing position.

Further embodiments of the disclosure are directed to a processing chamber comprising a sidewall, a lower wall and a lid forming an interior of the processing chamber. The lid comprises a showerhead and has a lower surface. The sidewall ahs a vacuum plenum and an opening forming fluid connection between the vacuum plenum and the interior of the processing chamber. The processing chamber includes a substrate support, an edge ring, a liner, an outer baffle ring and an inner baffle ring. The substrate support has an upper surface facing the lower surface of the lid. The substrate support is movable so that the upper surface can be moved closer to or further from the lower surface of the lid. The edge ring is on the substrate support and is sized to fit around an outer edge of a substrate. The liner is adjacent to the sidewall and has an extension that extends radially inward. The outer baffle ring is in a fixed position and comprises a plurality of openings aligned with the opening in the sidewall. The inner baffle ring comprises a plurality of openings and is positioned between the lower surface of the lid and the upper surface of the substrate support. The inner baffle ring is movable between a loading position in which the inner baffle ring contacts the extension of the liner and a processing position. Upward movement of the substrate support causes the edge ring to contact the inner baffle ring and lift the inner baffle ring off of the extension to move the inner baffle ring to a processing position. The outer baffle ring has in inner diameter sized to fit around an outer diameter of the inner baffle ring and at least a portion of the substrate support. When the inner baffle ring is in the processing position, a processing region is defined by the lid, inner baffle ring and substrate support.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure are directed to gas distribution apparatus for use in chemical vapor deposition type processes. One or more embodiments of the disclosure are directed to atomic layer deposition processes and apparatus (also called cyclical deposition) incorporating the gas distribution apparatus described. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the disclosure.

Some embodiments of the disclosure are directed to retrofitable solutions for existing chambers to allow for plasma enhanced atomic layer deposition processes that use rapid purging and switching of precursors to achieve rapid cycling using closely coupled fast actuation diaphragm valves. A ceramic (or other material) ring can be used to reduce the process volume. The ring can rest on or contact a liner above the slit valve area during wafer transfers; avoiding interference with the transfer process and hardware. The ring can be picked up by the pedestal heater during movement. The ring can contact an O-ring or sealing ring positioned in the faceplate at process position to allow for a gap between the wafer and the faceplate in the range of about 2 mm to about 8 mm. The process gases can be introduced through an opening in one side of the faceplate and distributed across the wafer in a cross-flow pattern in the process volume above the wafer. The gases can be pumped out through holes in the ring.

Some embodiments of the disclosure advantageously minimize the process chamber volume to allow for more efficient utilization of precursors. For example, high cost precursors or plasma processing, or both, may be more productive with smaller process volumes. Some embodiments advantageously allow for processes to operate at higher pressures and/or lower temperatures with highly reactive and costly precursors. In some embodiments, the cross-flow gas distribution in the process area is changed to a showerhead style gas distribution allowing for the ability to operate with or without a seal at the ring to faceplate interface. Some embodiments allow for changing of the process volume by changing the ring. In one or more embodiments, the ring can be retrofit into an existing processing chamber.

Figure 1:
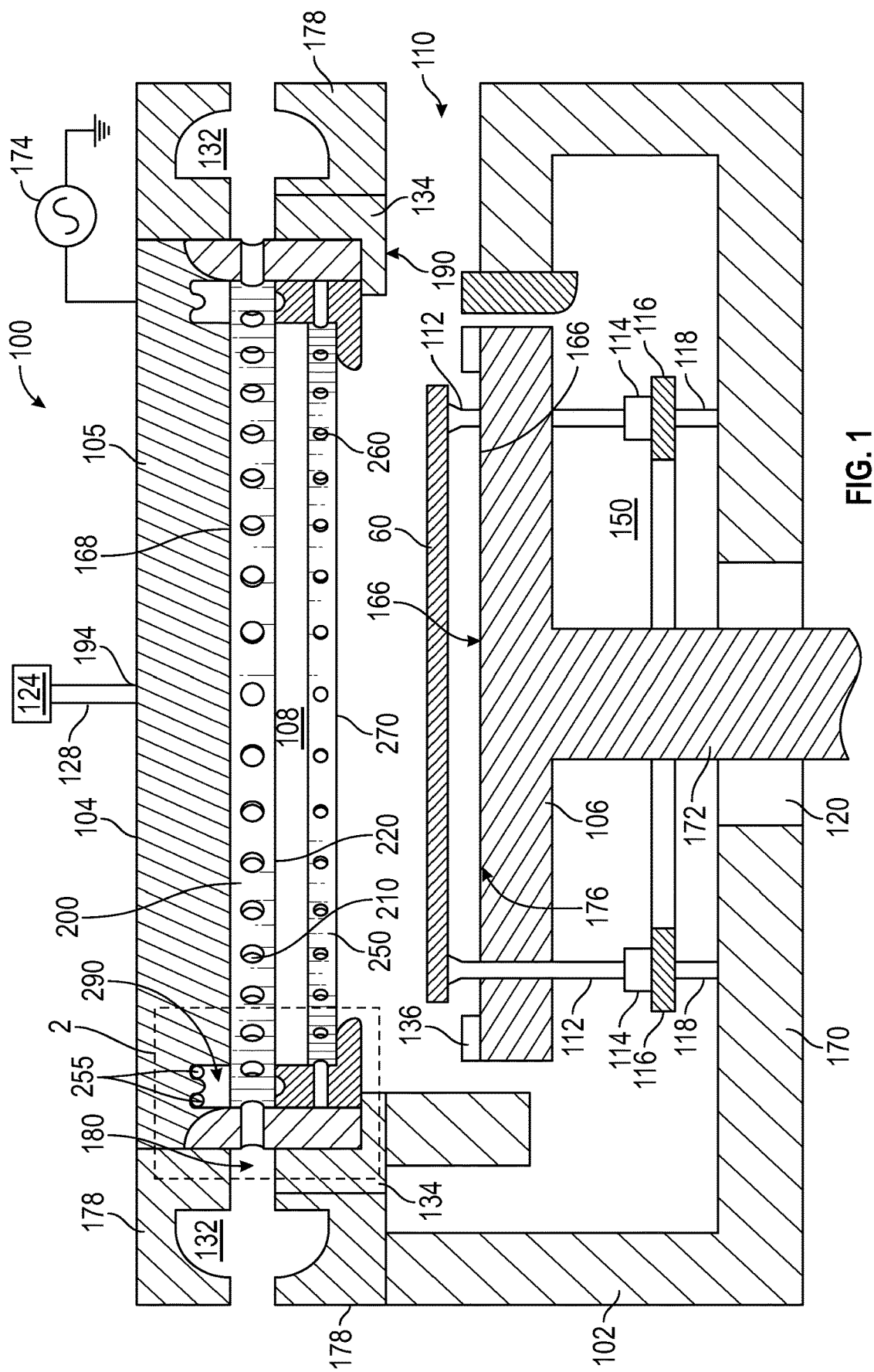
FIG. 1 is a cross-sectional view of a processing chamber according to one embodiment.

FIG. 1 is a cross-sectional view of a processing chamber 100 according to one embodiment. The processing chamber 100 has a chamber body 102 and a chamber lid 104 that couples to the chamber body 102 to define an interior 150. A substrate support 106 is disposed in the interior 150 of the chamber 100. An upper surface 166 of the substrate support 106 and a lower surface 168 of the chamber lid 104 define a processing region 108 in which a substrate disposed in a substrate contact area 176 on the upper surface 166 of the substrate support 106 is exposed to a processing environment.

Figure 3:
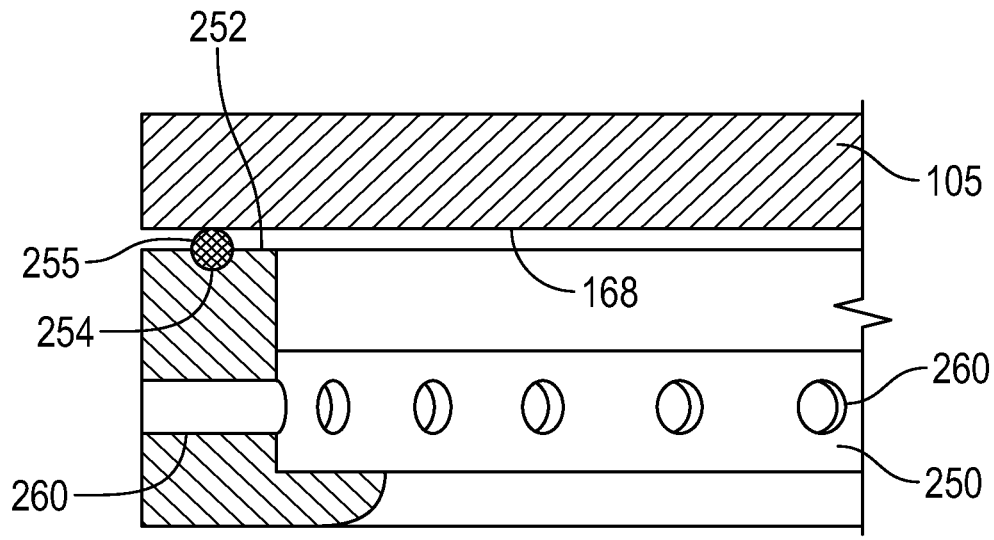
FIG. 3 is a partial cross-sectional view of a processing chamber in accordance with one or more embodiments of the disclosure.

Substrates enter and exit the processing chamber 100 through a substrate passage 110 in the chamber body 102. The substrate support 106 is movable along a longitudinal axis, for example a vertical axis, of the chamber 100 to position the substrate support 106 alternately in a substrate handling position (as shown in FIG. 1), with the upper surface 166 of the substrate support 106 proximate the passage 110, and a substrate processing position (as shown in FIG. 3), with the upper surface 166 of the substrate support 106 proximate the lower surface 168 of the chamber lid 104. A shaft 172 of the substrate support 106 typically extends through an opening 120 in a lower wall 170 of the chamber body 102 and couples to a lift mechanism (not shown) to actuate movement of the substrate support 106.

A substrate elevator 112 is disposed through the substrate support 106. The substrate elevator 112 has a base 114 that contacts an actuator 116 disposed in a lower area of the interior 150 of the chamber 100. The actuator 116 may be supported from the lower wall 170 by a support member 118. The actuator 116 may be an annular member, such as a ring, and the support member 118 may be an annular protrusion from the actuator 116. The actuator 116, the support member 118, or both may alternately be segmented. For example, either or both may be a segmented annular member, or the actuator 116 may be a pad, post, or spindle positioned to engage the base 114 of the substrate elevator 112.

The support member 118 maintains the actuator 116 in a substantially parallel relation to the upper surface 166 of the substrate support 106. When the substrate support 106 is moved from the processing position to the substrate handling position, the base 114 of the substrate elevator 112 contacts the actuator 116, causing the substrate elevator 112 to protrude through the upper surface 166 of the substrate support 106 and lift a substrate 60 disposed thereon above the upper surface 166 for access by a substrate handling robot (not shown) through the passage 110. Only two substrate elevators 112 are visible in the view of FIG. 1, but a typical embodiment will have three or more substrate elevators 112 distributed to provide stable stationing for substrate handling.

The chamber lid 104 may be an electrode, and may be coupled to a source of RF power 174. If the chamber lid 104 is an electrode, the chamber lid 104 will typically include a conductive material. The chamber lid 104 may be entirely or substantially made of a conductive material, or may be coated with a conductive material. If the chamber lid 104 is used as an electrode, the lower surface 168 of the chamber lid 104 will be conductive to provide RF coupling into the processing region 108 proximate the upper surface 166 of the substrate support 106. In one embodiment, the chamber lid 104 is aluminum.

A gas manifold 124 is coupled to the chamber lid 104 at a port 194. Process gases are delivered to the chamber through a gas line 128. The gas manifold 124 of some embodiments includes one or more high speed valves and precursor sources. The high speed valves control flow of gases through the gas line 128 into the chamber 100. The high speed valves may be ALD valves, and in some embodiments may be capable of opening or closing in less than 1 second, and in some cases less than 0.25 seconds. A precursor line may be coupled to one or more of the high speed valves. Other high speed valves may be used to join other precursor lines to deliver more than one gas, either simultaneously or separately, through the gas line 128. Operation of the high speed valves may allow for rapid switching of gas flows as needed for chamber operations, such as ALD deposition cycles.

The gas inlet 122 can be located in any suitable location. For example, the gas inlet 122 can be located in a peripheral region of the chamber lid 104 or in the center of the chamber lid 104. The chamber lid 104 comprises a gas showerhead 105 to deliver one or more reactive gas to the processing region 108. The showerhead 105 can be any suitable gas delivery device including, but not limited to, spiral showerheads with one, two or more separate delivery channels, vortex lids with gas diffusers and showerheads. The showerhead 105 of various embodiments provides a flow of reactive gas or gases toward the substrate 60 in a uniform manner. In some embodiments, the showerhead 105 provides a flow of gas substantially orthogonal to the substrate surface.

An edge ring 136 may be disposed around a peripheral region of the substrate support 106. The edge ring 136 may be an annular member having an inner dimension and an outer dimension. The inner dimension of the edge ring 136 may be substantially the same as a dimension of the substrate contact area 176 such that a substrate disposed on the substrate support nests inside the edge ring 136, as shown in FIG. 1. The inner dimension of the edge ring 136 may also be larger than the dimension of the substrate contact area 176. The inner dimension of the edge ring 136 may also be smaller than the substrate contact area 176 so that a portion of the edge ring 136 extends over an edge of the substrate. The edge ring 136 of FIG. 1 rests on the substrate support 106 and may move with the substrate support 106. In some embodiments, the edge ring 136 does not rest on the substrate support 106 and may be fixed or independently movable.

A pumping plenum 132 is located in a side wall 178 of the chamber body 102 proximate the processing position of the substrate support 106. The pumping plenum 132 is an annular passage around the processing region 108 where processing gases are evacuated from the processing region 108. A liner 134 separates the pumping plenum 132 from the processing region 108. The liner 134 has an opening 180 that allows process gases to flow from the processing region 108 into the pumping plenum 132.

Some embodiments of the disclosure incorporate an outer baffle ring 200 and an inner baffle ring 250 to minimize the volume of the processing chamber. The outer baffle ring 200 and inner baffle ring 250 can also be used to increase the resistance to gas flowing from the showerhead 105 out of the processing chamber to exhaust. Without being bound by any particular theory of operation, it is believed that restricting the gas flow from the showerhead 105 to exhaust can allow for decreasing the volume of the processing region 108.

Figure 2A:
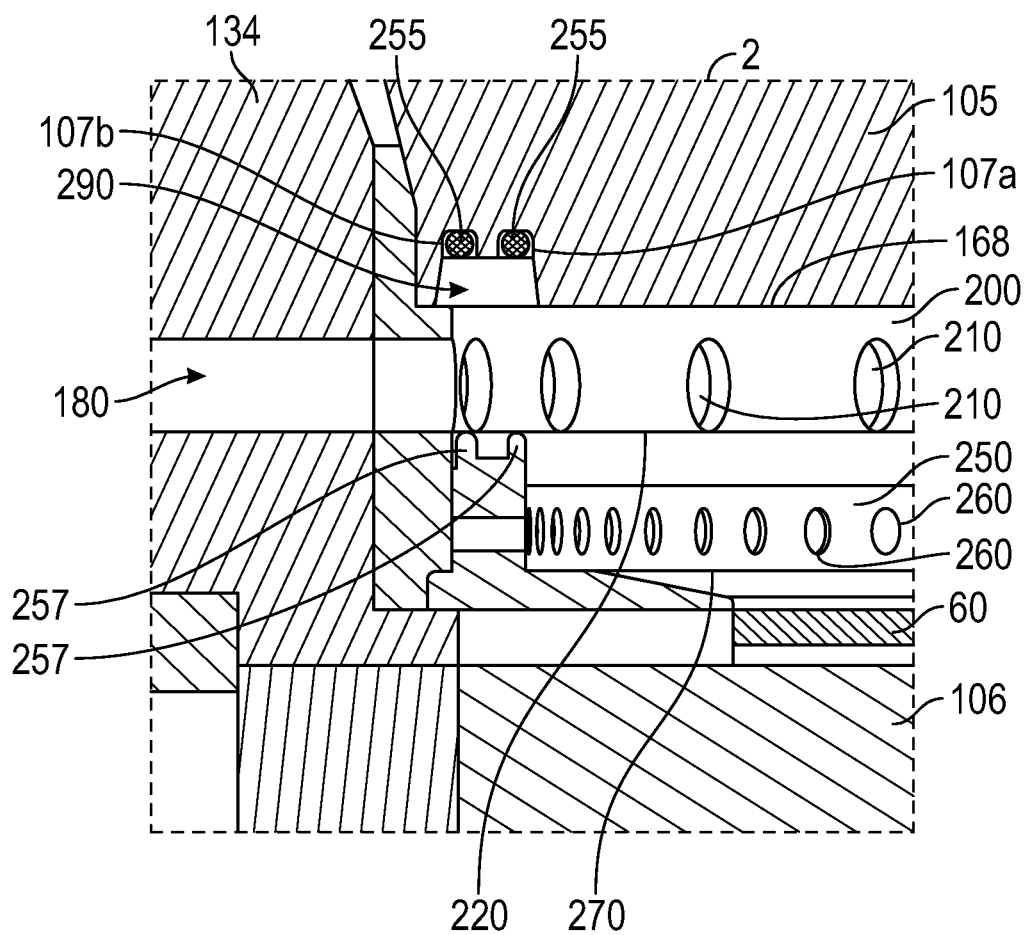
FIGS. 2A and 2B are detailed views of portions of the chamber of FIG. 1.
Figure 2B:
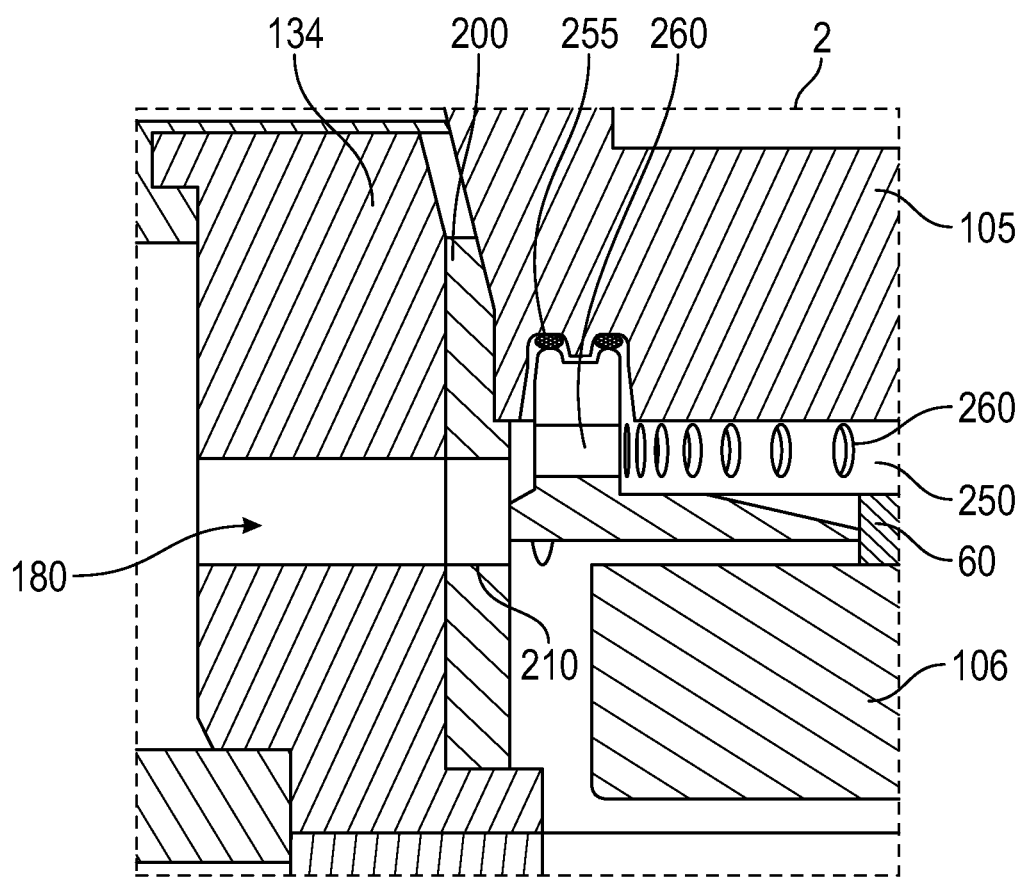

FIGS. 2A and 2B show expanded views of region 2 from FIG. 1 when the substrate support 106 is in the loading position (FIG. 2A) and in a processing position (FIG. 2B). The outer baffle ring 200 can be fixed or movable. In the embodiment shown, the outer baffle ring 200 is in a fixed position in contact with the lower surface of the showerhead 105. The outer baffle ring 200 includes a plurality of openings 210 to allow a flow of gas to pass through the outer baffle ring 200. In use, the outer baffle ring 200 is positioned so that at least some of the openings 210 are aligned with the opening 180 in liner 134.

The outer baffle ring 200 can have any suitable diameter and any suitable height depending on, for example, the diameter of the substrate to be processed and the targeted processing volume. In some embodiments, the outer baffle ring 200 has an inner diameter in the range of about 25 mm to about 1000 mm, or in the range of about 100 mm to about 400 mm. In some embodiments, the outer baffle ring 200 has an inner diameter that is substantially the same as the diameter of the substrate being processed. As used in this regard, the term "substantially the same" means that the inner diameter of the outer baffle ring 200 is within ±10 mm of the diameter of the substrate.

Some embodiments incorporate an inner baffle ring 250. In embodiments with an inner baffle ring 250, the outer baffle ring 200 has an inner diameter that is greater than an outer diameter of the inner baffle ring 250 to allow the inner baffle ring 250 to be moved into a position within the outer baffle ring 200.

The thickness of wall of the outer baffle ring 200 can also be modified to decrease the processing volume. A thicker wall will provide a smaller inner diameter. In some embodiments, the outer baffle ring 200 has a height that is sufficient to allow a plasma to be ignited within the processing region 108.

In use, the opening 180 can be located adjacent the upper surface 166 of the substrate support 106 when the substrate support 106 is in the processing position. In some embodiments, the openings 210 in the outer baffle ring 200 are aligned with the opening 180 in the liner 134. In some embodiments, the openings 210 in the outer baffle ring 200 are misaligned with the opening 180 in the liner 134 to increase the resistance to gas flowing through the openings 210 in the outer baffle ring 200.

In use, the substrate support 106 can be elevated so that the upper surface 166 of the substrate support 106 is close to or in contact with a lower edge 220 of the outer baffle ring 200. The outer baffle ring 200 can forms an annular boundary to the processing region 108 allowing reactive gases to flow through the openings 210.

In some embodiments, the showerhead 105 is an electrode for plasma generation. When the outer baffle ring 200 engages with the electrode, the outer baffle ring 200 forms a minimum volume reaction space around the substrate 60 with less than about 10 mm directly above the substrate. For a 300 mm circular substrate, the reaction volume of some embodiments is no more than about 250 mL, 225 mL, 200 mL, 175 mL, 150 mL, 125 mL or 100 mL. The small reaction volume helps to promote fast switching of gases for an ALD process.

The embodiment shown includes an extension 190 of the liner 134 which extends radially inward and provides a support for the outer baffle ring 200. In some embodiments, the outer baffle ring 200 is connected to the showerhead.

The number and size of the openings 210 in the outer baffle ring 200 can be varied. More openings 210 will allow a greater flow of gas from the processing region 108 than a similar ring with fewer openings 210 of the same size. The number of openings can be adjusted to change the flow resistance. Similarly, smaller openings 210 will create a greater resistance to gas flow than larger openings.

Some embodiments, as shown in the Figures, include an inner baffle ring 250 in addition to the outer baffle ring 200. The inner baffle ring 250 is movable from a first position shown in FIG. 2A to a second position shown in FIG. 2B inside the outer baffle ring 200. The inner baffle ring 250 includes a plurality of openings 260 to allow a flow of gas to pass through the inner baffle ring 250. In some embodiments, the inner baffle ring 250 is positioned so that at least some of the openings 260 are aligned with the openings 210 in the outer baffle ring 200 and the opening 180 in liner 134.

The inner baffle ring 250 can have any suitable diameter and any suitable height depending on, for example, the diameter of the substrate to be processed and the targeted processing volume. In some embodiments, the inner baffle ring 250 has an inner diameter in the range of about 25 mm to about 1000 mm, or in the range of about 100 mm to about 400 mm. In one or more embodiments, the inner baffle ring 250 has an inner diameter that is greater than or equal to about 10 mm larger than the diameter of the substrate to be processed. In some embodiments, the inner diameter of the inner baffle ring 250 is greater than the diameter of the substrate to by processed by an amount greater than or equal to about 10 mm, 15 mm, 20 mm or 25 mm. In some embodiments, the inner baffle ring 250 has an inner diameter that is substantially the same as the diameter of the substrate being processed. As used in this regard, the term "substantially the same" means that the inner diameter of the outer baffle ring 200 is within ±10 mm of the diameter of the substrate. In some embodiments, inner baffle ring 250 has an outer diameter than is less than the inner diameter of the outer baffle ring 200 so that the inner baffle ring 250 can be moved into a position within the outer baffle ring 200 without contacting the outer baffle ring 200.

The thickness of wall of the inner baffle ring 250 can also be modified to decrease the processing volume. A thicker wall will provide a smaller inner diameter. In some embodiments, the inner baffle ring 250 has a height that is sufficient to allow a plasma to be ignited within the processing region 108. In use, the inner baffle ring 250 can be used to decrease the volume of the processing region 108. The distance between the upper surface 166 of the substrate support 106 and the lower surface 168 of the showerhead 105 defines the height of the processing region 108. The inner baffle ring 250 can define the height of the processing region 108 because the substrate support 106 cannot move closer to the showerhead 105 than the height of the inner baffle ring 250. The inner baffle ring 250 of some embodiments has a height greater than or equal to about $\frac{1}{100}^{th}$ of the diameter of the substrate to be processed. For example, if a 300 mm substrate is being processed, the minimum height of the inner baffle ring 250 is about 3 mm. In some embodiments, the inner baffle ring 250 has a height greater than or equal to about 0.5 mm, 1 mm, 1.5 mm, 2 mm, 2.5 mm, 3 mm, 3.5 mm, 4 mm, 4.5 mm or 5 mm. In some embodiments, the inner baffle ring 250 is positioned above the substrate to be processed at a height greater than or equal to about 0.5 mm, 1 mm, 1.5 mm, 2 mm, 2.5 mm, 3 mm, 3.5 mm, 4 mm, 4.5 mm or 5 mm.

The inner baffle ring 250 and outer baffle ring 200 can be made from any suitable materials depending on, for example, the processing temperature and reactive gases. In some embodiments, the inner baffle ring 250 and the outer baffle ring 200 are independently selected from a metal, plastic or ceramic material. Suitable examples include, but are not limited to, aluminum, titanium, stainless steel, PEEK, Torlon, Vespel, alumina, aluminum nitride and zirconia.

In use, the substrate support 106 can be elevated so that the upper surface 166 of the substrate support 106 is close to or in contact with a lower edge 220 of the outer baffle ring 200. During elevation, the substrate support 106 can contact a lower edge 270 of the inner baffle ring 250. The substrate support 106 can then lift the inner baffle ring 250 into position for processing. During processing, the inner baffle ring 250 can form an annular boundary to the processing region 108 allowing reactive gases to flow through the openings 260 into a region between the inner baffle ring 250 and the outer baffle ring 200. The gases can then flow from the region between the rings through openings 210 in the outer baffle ring 200.

In the embodiment shown, in the loading position, the inner baffle ring 250 is supported by extension 190. This may be used to ensure that the inner baffle ring 250 is not in the way during loading and unloading of the substrate 60.

The inner baffle ring 250 may be changed to decrease or increase the processing volume. For example, if an expensive precursor is to be used, the inner baffle ring 250 may be exchanged with an inner baffle ring with a smaller height or inner diameter to decrease the reaction volume. When moving to the processing position, the inner baffle ring 250 and the substrate support 106 can be moved inside the outer baffle ring 200 so that the inner baffle ring 250 defines the annular edge of the processing region 108.

A seal may be formed between components of the processing chamber to form an isolated processing region 108. The seal can be formed between the inner baffle ring 250 and the showerhead 105, between the inner baffle ring 250 and the substrate support 106, between the outer baffle ring 200 and the showerhead 105, between the outer baffle ring 200 and the substrate support 106, or combinations thereof. For example, a seal may be formed between the inner baffle ring 250 and the showerhead 105 above and the between the inner baffle ring 250 and the substrate support 106 below to isolate processing region 108 within.

FIG. 3 shows an embodiment in which a face seal is formed between the inner baffle ring 250 and the showerhead 105. A sealing ring 255 is positioned between a top edge 252 of the inner baffle ring 250 and the lower surface 168 of the showerhead. The sealing ring 255 can be positioned within a groove or annular channel 254 formed in the top edge 252 of the inner baffle ring 250. Similarly, a groove or channel may be formed in the lower surface 168 of the showerhead 105. The annular channel 254 may be sized to retain the sealing ring 255 while allowing for expansion of the sealing ring upon compression.

Figure 4:
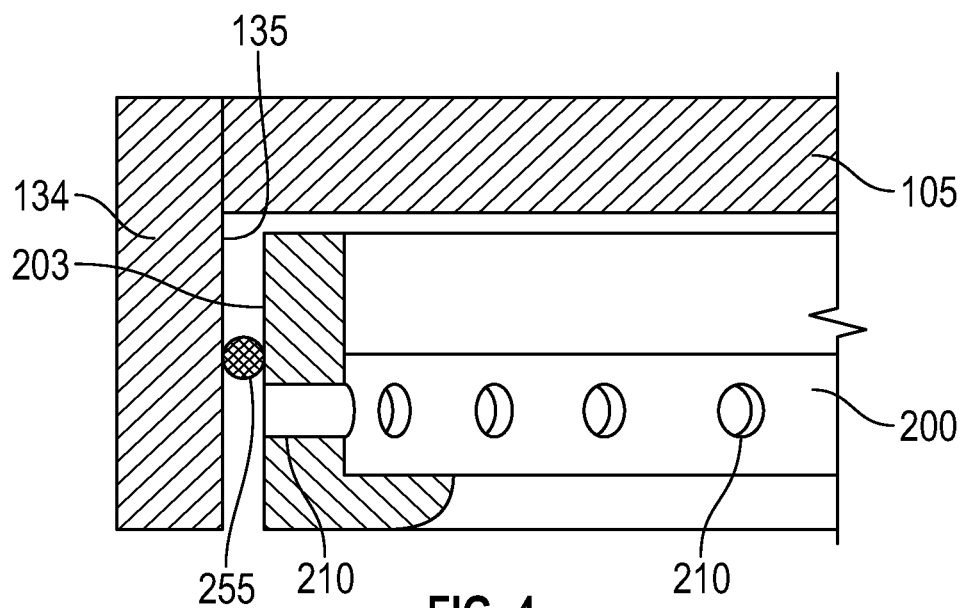
FIG. 4 is a partial cross-sectional view of a processing chamber in accordance with one or more embodiments of the disclosure.

In the embodiment shown in FIG. 4, a sealing ring 255 is positioned between an outer peripheral edge 203 of the outer baffle ring 200 and a face 135 of the liner 134 to form a piston or lip seal. The sealing ring 255 may be fixed in position in the face 135 of the liner 134 allowing the outer baffle ring 200 to move vertically while maintaining the seal. Similarly, as will be appreciated by the skilled artisan, a seal can be formed between an outer peripheral edge of the inner baffle ring 250 and an inner face of the outer baffle ring 200.

In some embodiments, there are multiple sealing rings 255 positioned to provide redundant seals. FIGS. 1, 2A and 2B show an embodiment with two sealing rings 255. The showerhead 105 of some embodiments includes a recess 290 sized to cooperatively interact with a top edge 252 of the inner baffle ring 250. The recess 290 includes two sealing rings 255 positioned in separate annular channels 107a, 107b. The inner annular channel 107a has a smaller diameter than the outer annular channel 107b. The inner annular channel 107a and outer annular channel 107b can be concentric. The top edge 252 of the inner baffle ring 250 shown has two protrusions 257 that are spaced to be aligned with the annular channels 107a, 107b. When the inner baffle ring 250 is elevated, the protrusions 257 contact the sealing rings 255 inside the annular channels 107a, 107b to form a seal. If the sealing ring 255 in the inner annular channel 107a fails, the sealing ring 255 in the outer annular channel 107b can maintain the seal.

Figure 5:
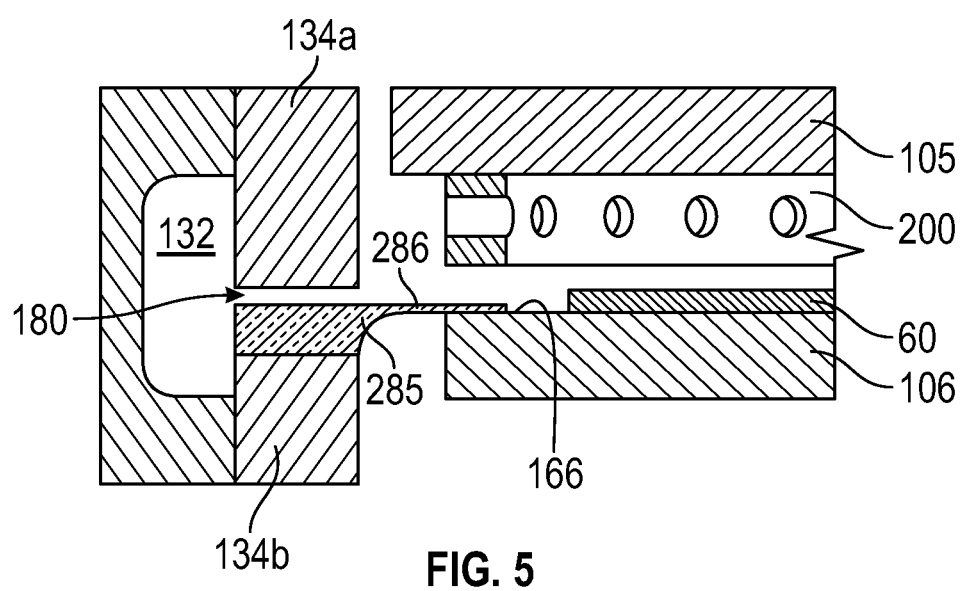
FIG. 5 a partial cross-sectional view of a processing chamber in accordance with one or more embodiments of the disclosure.

FIG. 5 shows an alternate embodiment in which a sealing ring 285 is positioned to contact the upper surface 166 of the substrate support 106. As shown, the sealing ring 285 may include a flexible protrusion 286 that can contact the substrate support 106. The sealing ring 285 can be positioned at a lower edge of the opening 180 that forms a fluid connection between the processing region 108 and the plenum 132 separating an upper liner 134*a* and a lower liner 134*b*. In this position, the sealing ring 285 helps form a lower edge of the processing region 108 so that the connection to the vacuum through the plenum is at the lower edge of the processing region 108.

The sealing ring 285 can be made from any suitable material and have any suitable dimensions. In some embodiments, the sealing ring 285 comprises aluminum nitride. In some embodiments, the flexible protrusion 286 has a thickness in the range of about 0.1 to about 0.3 mm.

The terms "upper", "lower", "top", and "bottom", as may be encountered throughout this description, are descriptions of directions relative to the orientation of the apparatus being described, and are not intended to limit the apparatus so described to any absolute orientation The apparatus described can be used to form one or more layers during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). Remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required.

According to one or more embodiments, the substrate may be processed prior to and/or after use in the apparatus. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

A substrate can be processed in single substrate deposition chambers using, for example, the apparatus described. In such chambers, a single substrate is loaded, processed and unloaded before another substrate is processed. A substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising a lid having a lower surface; a substrate support having an upper surface facing the lower surface of the lid; and an inner baffle ring comprising a plurality of openings, the inner baffle ring positioned between the lower surface of the lid and the upper surface of the substrate support, the inner baffle ring is movable between a loading position and a processing position.

2. The processing chamber of claim 1, further comprising a vacuum liner around an outer edge of the processing chamber, the vacuum liner including an extension that supports the inner baffle ring when the inner baffle ring is in the loading position.

3. The processing chamber of claim 2, wherein upward movement of the substrate support causing the upper surface of the substrate support to contact the inner baffle ring and lift the inner baffle ring off of the extension to move to the processing position.

4. The processing chamber of claim 3, wherein the substrate support comprises an edge ring positioned to contact the inner baffle ring.

5. The processing chamber of claim 1, further comprising a vacuum plenum in a sidewall of the processing chamber and an opening forming a fluid connection between the vacuum plenum and a processing region defined by the lid, inner baffle ring and substrate support.

6. The processing chamber of claim 5, wherein the opening in the sidewall is substantially aligned with at least one opening in the inner baffle ring.

7. The processing chamber of claim 1, wherein the lid further comprises a recess sized to cooperatively interact with a top edge of the inner baffle ring when the inner baffle ring is in the processing position.

8. The processing chamber of claim 7, wherein the recess in the lid further comprises at least one sealing ring to form a seal between the lid and the inner baffle ring when the inner baffle ring is in the processing position.

9. The processing chamber of claim 1, further comprising an outer baffle ring, the outer baffle ring having a plurality of openings and an inner diameter greater than an outer diameter of the inner baffle ring.

10. The processing chamber of claim 9, wherein the outer baffle ring is fixed in place to in a fixed position in contact with the lower surface of the lid so that when the inner baffle ring is in the processing position, the inner baffle ring is within the outer baffle ring.

11. The processing chamber of claim 9, wherein the outer baffle ring has an inner diameter sized to fit around the substrate support.

12. The processing chamber of claim 9, wherein the plurality of openings are aligned with an opening in a sidewall of the processing chamber, the opening in fluid communication with a vacuum plenum in the sidewall.

13. A processing chamber comprising a sidewall, a lower wall and a lid, the lid having a lower surface, the sidewall having a vacuum plenum and an opening forming fluid connection between the vacuum plenum and an interior of the processing chamber; a substrate support having an upper surface facing the lower surface of the lid, the substrate support movable so that the upper surface can be moved closer to or further from the lower surface of the lid; a liner adjacent the sidewall and having an extension that extends radially inward; an outer baffle ring comprising a plurality of openings, the openings aligned with the opening in the sidewall; and an inner baffle ring comprising a plurality of openings, the inner baffle ring positioned between the lower surface of the lid and the upper surface of the substrate support, the inner baffle ring movable between a loading position in which the inner baffle ring contacts the extension of the liner and a processing position.

14. The processing chamber of claim 13, wherein upward movement of the substrate support causing the upper surface of the substrate support to contact the inner baffle ring and lift the inner baffle ring off of the extension to move to the processing position.

15. The processing chamber of claim 14, wherein the substrate support comprises an edge ring positioned to contact the inner baffle ring.

16. The processing chamber of claim 13, wherein the lid further comprises a recess sized to cooperatively interact with a top edge of the inner baffle ring when the inner baffle ring is in the processing position.

17. The processing chamber of claim 16, wherein the recess in the lid further comprises at least one sealing ring to form a seal between the lid and the inner baffle ring when the inner baffle ring is in the processing position.

18. The processing chamber of claim 13, wherein the outer baffle ring has an inner diameter sized to fit around the substrate support.

19. A processing chamber comprising a sidewall, a lower wall and a lid forming an interior of the processing chamber, the lid comprising a showerhead and having a lower surface, the sidewall having a vacuum plenum and an opening forming fluid connection between the vacuum plenum and the interior of the processing chamber; a substrate support having an upper surface facing the lower surface of the lid, the substrate support movable so that the upper surface can be moved closer to or further from the lower surface of the lid; an edge ring on the substrate support, the edge ring sized to fit around an outer edge of a substrate; a liner adjacent the sidewall and having an extension that extends radially inward; an outer baffle ring in a fixed position, the outer baffle ring comprising a plurality of openings, the openings aligned with the opening in the sidewall; and an inner baffle ring comprising a plurality of openings, the inner baffle ring positioned between the lower surface of the lid and the upper surface of the substrate support, the inner baffle ring movable between a loading position in which the inner baffle ring contacts the extension of the liner and a processing position, wherein upward movement of the substrate support causes the edge ring to contact the inner baffle ring and lift the inner baffle ring off of the extension to move to a processing position, the outer baffle ring having in inner diameter sized to fit around an outer diameter of the inner baffle ring and at least a portion of the substrate support, and when the inner baffle ring is in the processing position, a processing region is defined by the lid, inner baffle ring and substrate support.

\* \* \* \* \*

UNITED STATES PATENT AND TRADEMARK OFFICE
CERTIFICATE OF CORRECTION

PATENT NO. : 10,711,347 B2
APPLICATION NO. : 15/486548
DATED : July 14, 2020
INVENTOR(S) : Dale R. DuBois et al.

It is certified that error appears in the above-identified patent and that said Letters Patent is hereby corrected as shown below:

In the Claims

Column 11 (Line 61) In Claim 10, Line 2, delete "fixed in place to", after "ring is" and before "in a fixed".

Signed and Sealed this
Eighth Day of September, 2020

Andrei Iancu
*Director of the United States Patent and Trademark Office*